United States Patent
Jang et al.

(10) Patent No.: US 9,412,961 B2
(45) Date of Patent: Aug. 9, 2016

(54) METHOD OF MANUFACTURING ORGANIC LIGHT-EMITTING DISPLAY APPARATUS

(71) Applicant: SAMSUNG DISPLAY CO., LTD., Yongin, Gyeonggi-Do (KR)

(72) Inventors: Cheol-Min Jang, Yongin (KR); Myung-Soo Huh, Yongin (KR); Suk-Won Jung, Yongin (KR); Jae-Hyun Kim, Yongin (KR); Sung-Chul Kim, Yongin (KR); Jin-Kwang Kim, Yongin (KR); Chang-Woo Shim, Yongin (KR); Sung-Hun Key, Yongin (KR); In-Kyo Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 14 days.

(21) Appl. No.: 14/078,422

(22) Filed: Nov. 12, 2013

(65) Prior Publication Data

US 2014/0134768 A1    May 15, 2014

(30) Foreign Application Priority Data

Nov. 13, 2012 (KR) .................. 10-2012-0128370

(51) Int. Cl.
 *H01L 51/50* (2006.01)
 *H01L 51/56* (2006.01)
 *H01L 51/00* (2006.01)
 *C23C 16/40* (2006.01)
 *C23C 16/455* (2006.01)

(52) U.S. Cl.
 CPC .............. *H01L 51/50* (2013.01); *C23C 16/403* (2013.01); *C23C 16/45519* (2013.01); *C23C 16/45544* (2013.01); *H01L 51/001* (2013.01); *H01L 51/0011* (2013.01); *H01L 51/56* (2013.01)

(58) Field of Classification Search
 None
 See application file for complete search history.

(56) References Cited

U.S. PATENT DOCUMENTS

| 7,932,109 | B2 * | 4/2011 | Hayata et al. .................. 438/29 |
| 8,470,718 | B2 | 6/2013 | Lee |
| 2002/0007790 | A1 | 1/2002 | Park |
| 2003/0106643 | A1 * | 6/2003 | Tabuchi et al. ........... 156/345.35 |
| 2005/0284370 | A1 | 12/2005 | Strang |
| 2007/0238311 | A1 | 10/2007 | Levy |
| 2007/0281082 | A1 * | 12/2007 | Mokhlesi et al. .......... 427/248.1 |
| 2009/0047426 | A1 | 2/2009 | Park et al. |
| 2009/0162263 | A1 | 6/2009 | Chang et al. |
| 2009/0291211 | A1 * | 11/2009 | Ryu et al. ................. 427/255.23 |

(Continued)

FOREIGN PATENT DOCUMENTS

| JP | 2005-116898 | 4/2005 |
| KR | 10-2008-0109002 | 12/2008 |

(Continued)

*Primary Examiner* — Scott B Geyer
(74) *Attorney, Agent, or Firm* — Lewis Roca Rothgerber Christie LLP

(57) ABSTRACT

A vapor deposition apparatus for depositing a thin film on a substrate, by which a deposition process is efficiently performed and deposition film characteristics are easily improved, and a vapor deposition apparatus including: a stage onto which a substrate is disposed; and a supply unit disposed to face the substrate and having a main body member and a nozzle member disposed on one surface of the main body member facing the substrate, to sequentially supply a plurality of gases towards the substrate, and a method of manufacturing an organic light-emitting display apparatus using the same.

4 Claims, 12 Drawing Sheets

(56) References Cited

U.S. PATENT DOCUMENTS

| | | |
|---|---|---|
| 2010/0068413 A1 | 3/2010 | Lee |
| 2011/0233570 A1* | 9/2011 | Lee et al. ........................ 257/88 |
| 2012/0141676 A1 | 6/2012 | Sershen et al. |
| 2013/0323422 A1* | 12/2013 | Peidous ..................... 427/255.7 |

FOREIGN PATENT DOCUMENTS

| | | |
|---|---|---|
| KR | 10-2009-0018290 | 2/2009 |
| KR | 10-2010-0032315 | 3/2010 |

* cited by examiner

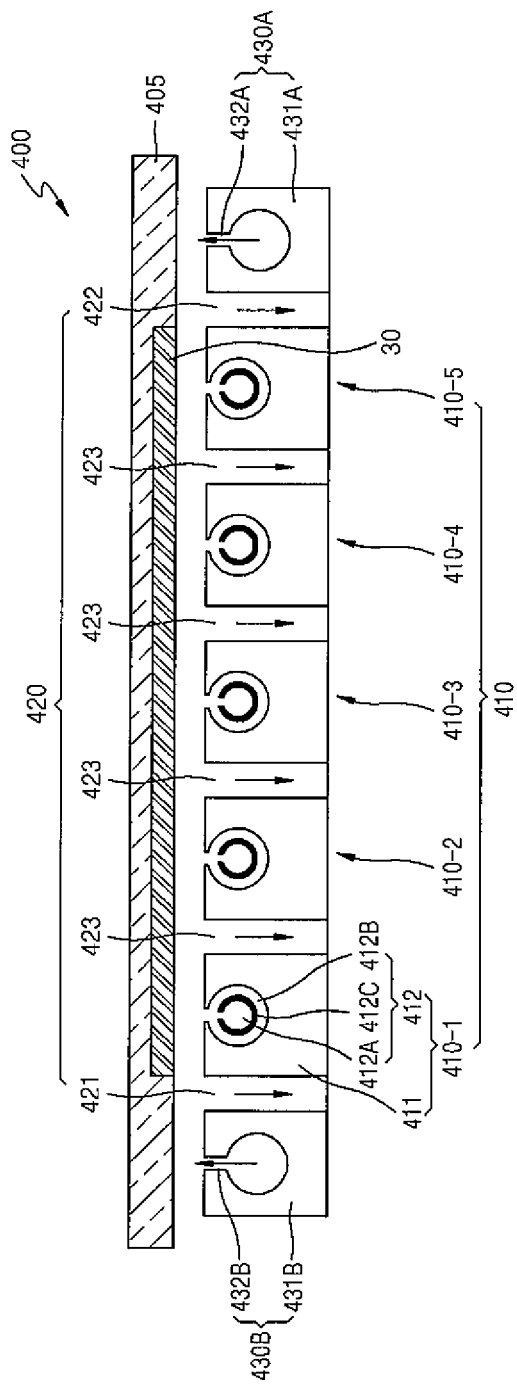

METHOD OF MANUFACTURING ORGANIC LIGHT-EMITTING DISPLAY APPARATUS

CROSS-REFERENCE TO RELATED APPLICATION

This application claims priority to and the benefit of Korean Patent Application No. 10-2012-0128370, filed on Nov. 13, 2012, in the Korean Intellectual Property Office, the disclosure of which is incorporated herein in its entirety by reference.

BACKGROUND

1. Field

Embodiments of the present invention relate to a vapor deposition apparatus and a method of manufacturing an organic light-emitting display apparatus. Embodiments of the present invention more particularly relate to a vapor deposition apparatus, by which a deposition process is efficiently performed and deposition film characteristics are easily improved, and a method of manufacturing an organic light-emitting display apparatus.

2. Description of the Related Art

Semiconductor devices, display apparatuses, other electronic devices, and the like include a plurality of thin films. One of various methods of forming the plurality of thin films is a vapor deposition method.

The vapor deposition method uses one or more gases as raw materials for forming a thin film. Examples of the vapor deposition method are chemical vapor deposition (CVD), atomic layer deposition (ALD), and the like.

During ALD, one raw material is injected and purged/pumped, one or more molecular layers are adsorbed onto a substrate, after which another raw material is injected and purged/pumped to thereby form a desired single atomic layer or multiple atomic layers.

Among display apparatuses, an organic light-emitting display apparatus has attracted attention as a next-generation display apparatus due to high-grade characteristics, such as wide angle of views, high contrast, and quick response speeds.

The organic light-emitting display apparatus includes an intermediate layer having an organic emission layer between a first electrode and a second electrode that face the first electrode and further includes one or more thin films. A deposition process may be used to form the one or more thin films of the organic light-emitting display apparatus.

However, it is not easy to deposit a large-area thin film having desired characteristics for a large-sized and high-resolution organic light-emitting display apparatus.

SUMMARY

Aspects of embodiments of the present invention include a vapor deposition apparatus, by which a deposition process is efficiently performed and deposition film characteristics are easily improved, and a method of manufacturing an organic light-emitting display apparatus.

Additional aspects will be set forth in part in the description which follows and, in part, will be apparent from the description, or may be learned by practice of the presented embodiments.

According to one or more embodiments of the present invention, a vapor deposition apparatus includes: a stage onto which a substrate is disposed; and a supply unit disposed to face the substrate and having a main body member and a nozzle member disposed on one surface of the main body member and facing the substrate, to sequentially supply a plurality of gases towards the substrate.

The nozzle member may sequentially inject a first raw material gas, a second raw material gas, and a purge gas towards the substrate.

The nozzle member may have a long extending shape.

The nozzle member may be formed to have a length that is equal to or greater than a width of one direction of the substrate so as to correspond to the width of the one direction of the substrate.

The nozzle member may be disposed to correspond to the center of the substrate.

The vapor deposition apparatus may further include an exhaust unit defined as separated spaces between edges of the stage and edges of the supply unit.

The stage may be disposed over the supply unit for the substrate to be disposed on the stage such that a surface of the substrate on which a deposition process is performed faces downward (e.g. towards the ground).

The vapor deposition apparatus may further include a curtain unit disposed to face the stage and deviate from opposite edges of the substrate and having curtain nozzles for injecting a purge gas (e.g. an inert gas).

The curtain nozzles may be disposed at the opposite edges of the substrate and facing the opposite edges.

The curtain nozzles may be disposed and oriented to all edges of the substrate.

The curtain nozzles may be formed in a rectangular ring shape.

The supply unit may include a plurality of supply modules, each supply module including a main body member and a nozzle member.

The exhaust unit may be disposed between every two adjacent supply modules.

The nozzle member may include a first supply region, a second supply region, and a partition disposed between the first supply region and the second supply region.

The first raw material gas may be injected from the first supply region, and the second raw material gas may be injected from the second supply region.

The purge gas may be discharged from the second supply region while the first raw material gas is being injected from the first supply region.

The purge gas may be discharged from the first supply region while the second raw material gas is being injected from the second supply region.

The vapor deposition apparatus may further include a linear gas supply line for supplying gases to the nozzle member of the supply unit.

The vapor deposition apparatus may further include a first valve, a second valve, and a third valve disposed to control a process of respectively delivering a first raw material gas, a second raw material gas, and a purge gas to the gas supply line.

The vapor deposition apparatus may further include a first purge gas valve, a second purge gas valve, and a third purge gas valve disposed in a direction farther from the gas supply line than the first valve, the second valve, and the third valve to control injection of the purge gas.

According to one or more embodiments of the present invention, a method of manufacturing an organic light-emitting display apparatus including a thin film on a substrate by using a vapor deposition apparatus, the vapor deposition apparatus including: a stage onto which the substrate is disposed; and a supply unit disposed to face the substrate and having a main body member and a nozzle member disposed on one surface of the main body member facing the substrate, to sequentially supply a plurality of gases towards the substrate, includes forming the thin film, wherein the forming of the thin film is performed by sequentially injecting different raw material gases from the nozzle member in a state where the substrate and the vapor deposition apparatus are fixed.

The organic light-emitting display apparatus may include a first electrode, an intermediate layer having an organic emission layer, a second electrode, and an encapsulating layer, and the forming of the thin film may include forming the encapsulating layer.

The forming of the thin film may include forming an insulating layer.

The forming of the thin film may include forming a conductive layer.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Figure 1:
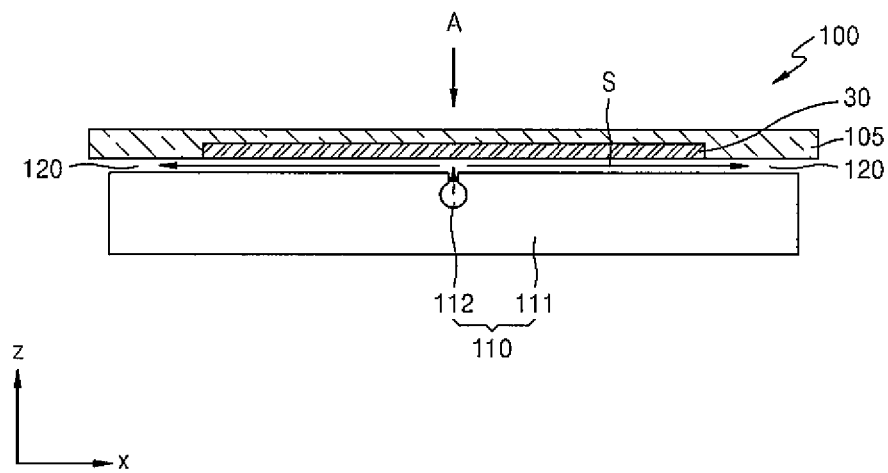
Figure 2:
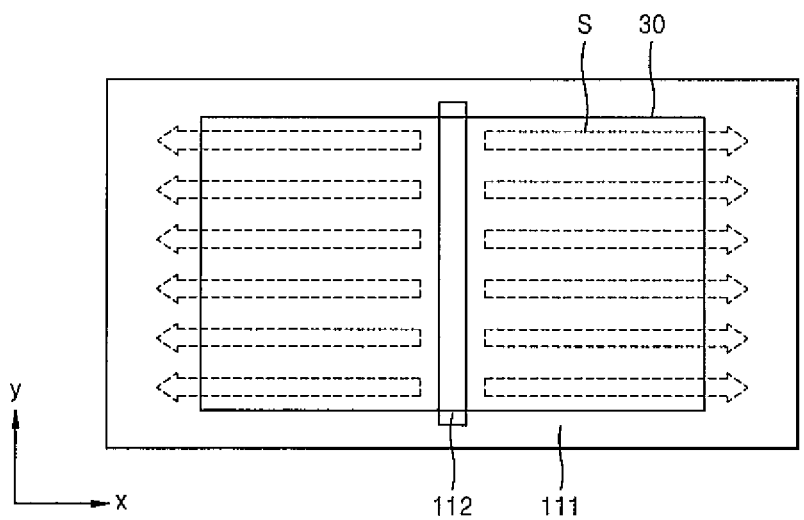
Figure 4:
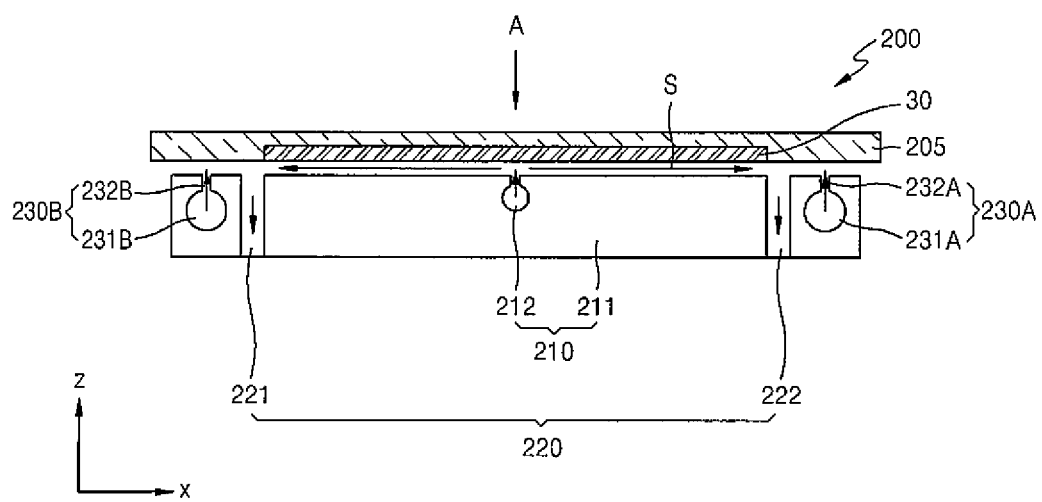
Figure 5:
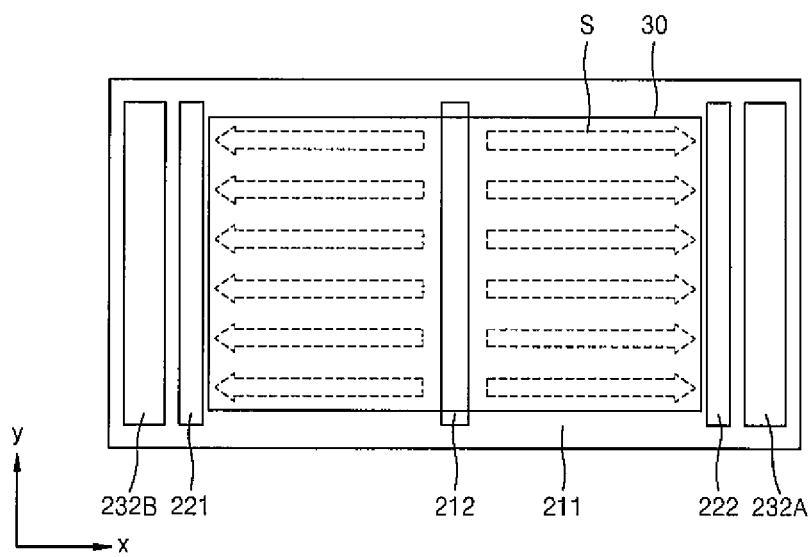
Figure 6:
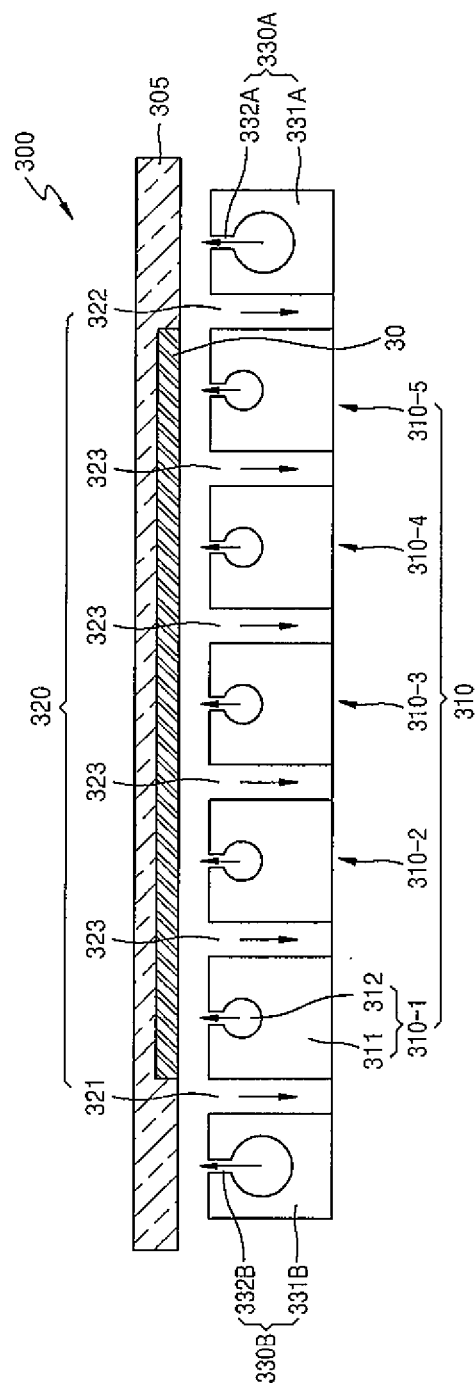
Figure 9:
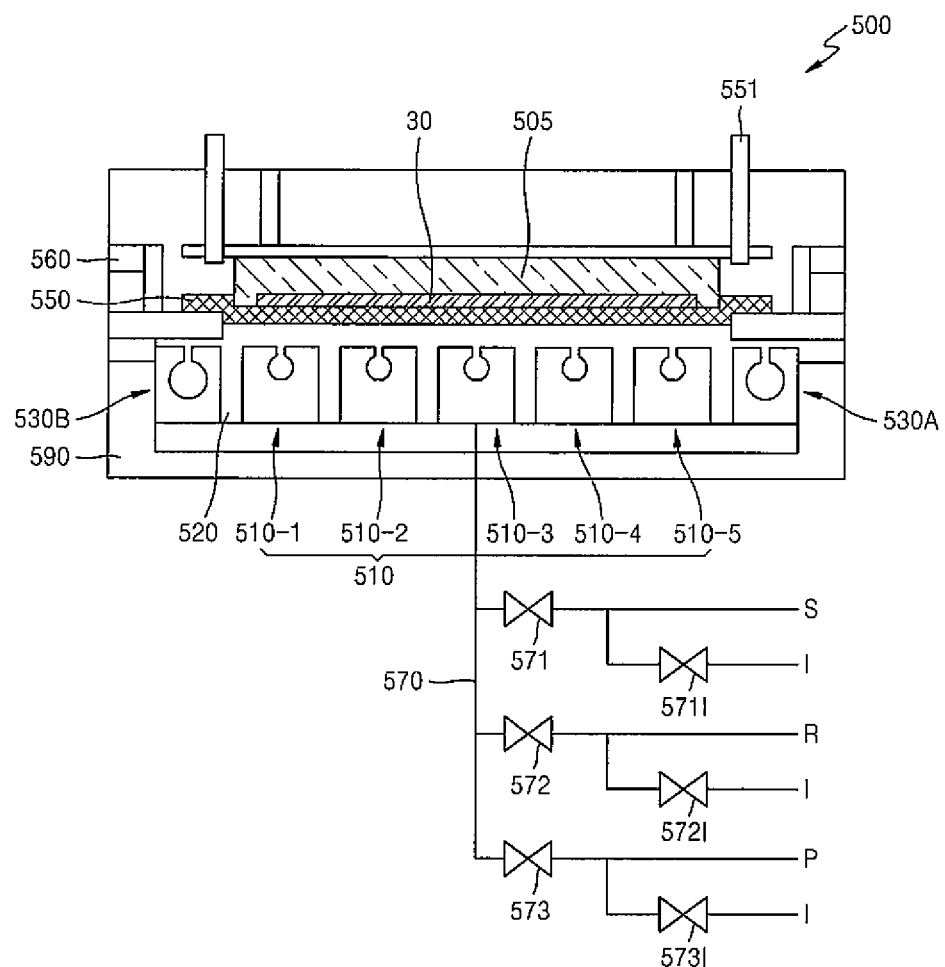
Figure 10:
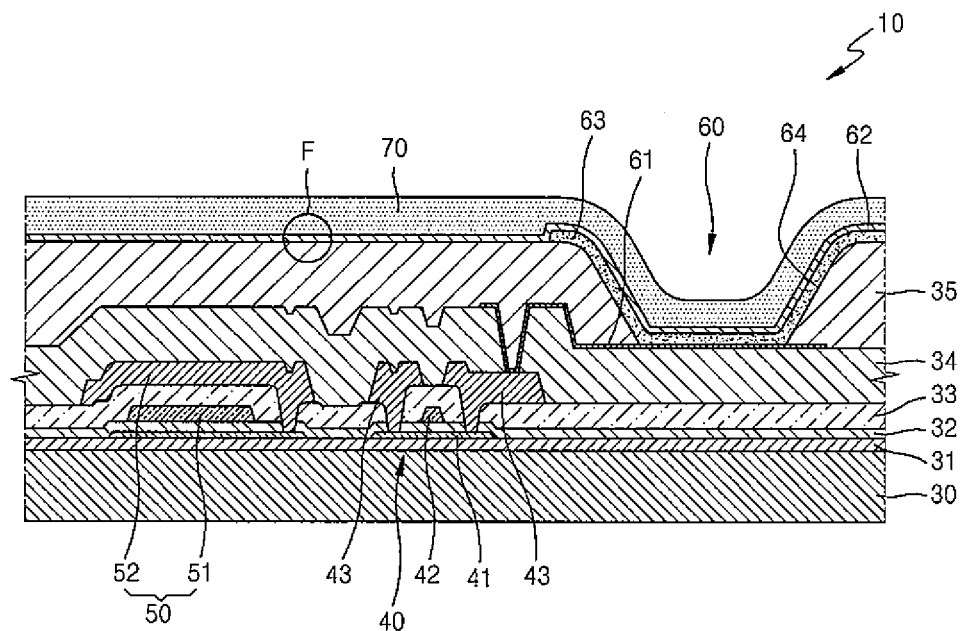
Figure 11:
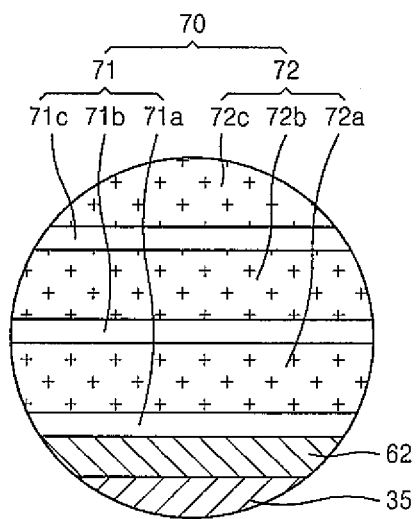

Embodiments of the present invention will become apparent and more readily appreciated from the following description of the embodiments, taken in conjunction with the accompanying drawings in which:

FIG. 1 is a schematic cross-sectional view of a vapor deposition apparatus according to an embodiment of the present invention;

FIG. 2 is a top view in a direction A of FIG. 1;

FIGS. 3A to 3D are cross-sectional views illustrating a deposition process using the vapor deposition apparatus of FIG. 1;

FIG. 4 is a schematic cross-sectional view of a vapor deposition apparatus according to another embodiment of the present invention;

FIG. 5 is a top view in a direction A of FIG. 4;

FIG. 6 is a schematic cross-sectional view of a vapor deposition apparatus according to another embodiment of the present invention;

FIG. 7 is a schematic cross-sectional view of a vapor deposition apparatus according to another embodiment of the present invention;

FIGS. 8A to 8D are cross-sectional views illustrating a deposition process using the vapor deposition apparatus of FIG. 7;

FIG. 9 is a schematic cross-sectional view of a vapor deposition apparatus according to another embodiment of the present invention;

FIG. 10 is a schematic cross-sectional view of an organic light-emitting display apparatus manufactured by a method of manufacturing an organic light-emitting display apparatus according to another embodiment of the present invention; and FIG. 11 is a magnified view of F of FIG. 10.

DETAILED DESCRIPTION

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items.

Expressions such as "at least one of," when preceding a list of elements, modify the entire list of elements and do not modify the individual elements of the list. Further, the use of "may" when describing embodiments of the present invention refers to "one or more embodiments of the present invention."

FIG. 1 is a schematic cross-sectional view of a vapor deposition apparatus 100 according to an embodiment of the present invention, and FIG. 2 is a top view in a direction A of FIG. 1.

Referring to FIGS. 1 and 2, the vapor deposition apparatus 100 may include a stage 105 and a supply unit 110.

A substrate 30 is disposed on the stage 105. The stage 105 is formed to stably fix the substrate 30 during a deposition process and may further include a clamp and the like. The stage 105 is disposed on the supply unit 110 such that a surface of the substrate 30, particularly, a surface on which the deposition process is to be performed, i.e., a lower surface of the substrate 30, faces the ground.

As shown in FIG. 1, the stage 105 may be formed to have a set or predetermined groove, wherein the substrate 30 is disposed in the groove. In this case, the substrate 30 is relatively stable on the stage 105, and an escape, vibration, and the like of the substrate 30 is prevented during the deposition process.

However, one or more embodiments of the present invention are not limited thereto, and the stage 105 may include no groove.

The supply unit 110 may include a main body member 111 and a nozzle member 112.

The main body member 111 supports the entire supply unit 110, functions as a housing, and may include therein a connection pipe for delivering a raw material to the nozzle member 112.

The nozzle member 112 is disposed on one surface of the main body member 111. The nozzle member 112 injects a gaseous raw material for performing the deposition process towards the substrate 30. For example, the nozzle member 112 injects a first raw material gas S towards the substrate 30. However, this is only illustrative, and the nozzle member 112 may sequentially and repeatedly inject a plurality of gases towards the substrate 30 to perform the deposition process on the substrate 30. A detailed description thereof will be made below.

The nozzle member 112 is a linear nozzle member having a long extending shape. That is, as shown in FIG. 2, the nozzle member 112 is formed to have a length that is greater than a width along one direction of the substrate 30. As another example, the nozzle member 112 may have a length that is the same as the width along the one direction of the substrate 30.

By doing this, the first raw material gas S injected from the nozzle member 112 uniformly reacts with the entire surface of the substrate 30, thereby uniformly performing the deposition process. In particular, the nozzle member 112 may be disposed to correspond to the center of the substrate 30 to thereby easily perform the uniform deposition process.

An exhaust unit 120 is formed to discharge residual gases after the deposition process. The exhaust unit 120 is defined by separated spaces between edges of the stage 105 and edges of the supply unit 110.

FIGS. 3A to 3D are cross-sectional views illustrating a deposition process using the vapor deposition apparatus 100 of FIG. 1.

Figure 3A:
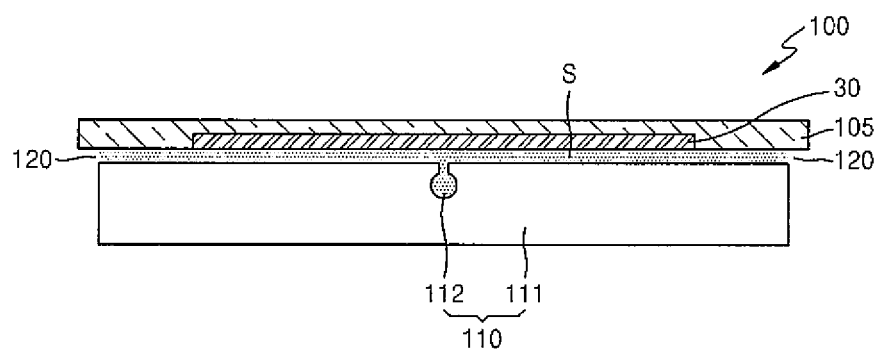

Referring to FIG. 3A, the first raw material gas S is injected in a direction of the substrate 30 from the nozzle member 112 of the supply unit 110. The first raw material gas S may include various suitable materials. The first raw material gas S may be a gas including aluminum (Al), e.g., trimethyl aluminum (TMA). In this case, when the first raw material gas S is injected in the direction of the substrate 30, an adsorption layer including Al is formed on the surface of the substrate 30. In more detail, a chemical adsorption layer and a physical adsorption layer are formed on the surface of the substrate 30.

Figure 3B:
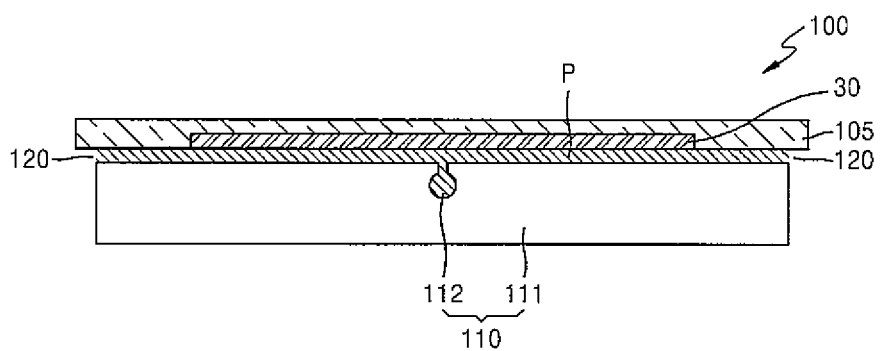

Thereafter, referring to FIG. 3B, a purge gas P is injected in the direction of the substrate 30 from the nozzle member 112 of the supply unit 110. The purge gas P may include various suitable materials. For example, the purge gas P may include an inert gas, e.g., argon or nitrogen.

The physical adsorption layer having a weak molecular bonding force in the adsorption layer described above which is formed on the surface of the substrate 30 with the first raw material gas S is separated from the substrate 30 due to the purge gas P, and the separated gas or residual substances are removed through the exhaust unit 120, thereby improving the purity of a deposition film to be finally formed on the substrate 30.

Figure 3C:
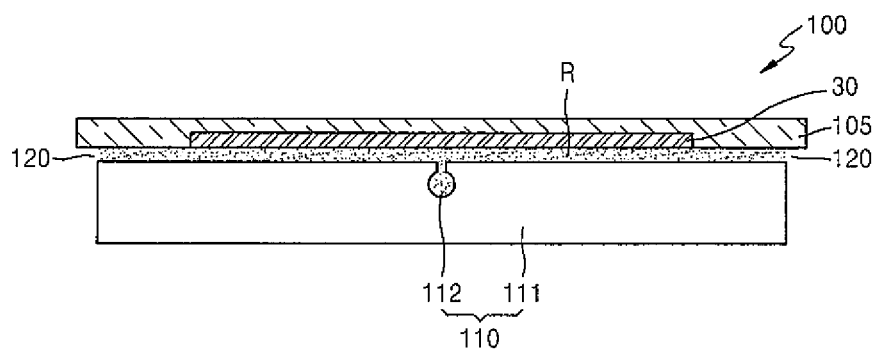

Thereafter, referring to FIG. 3C, a second raw material gas R is injected in the direction of the substrate 30 from the nozzle member 112 of the supply unit 110. The second raw material gas R may include various suitable materials. The second raw material gas R may include a gas including oxygen (O), e.g., hydrogen oxide ($H_2O$), dioxygen ($O_2$), and/or nitrogen oxide ($N_2O$). In addition, although not shown, when the second raw material gas R is injected, the second raw material gas R may be converted into a radical form by generating plasma and injected to the substrate 30.

When the second raw material gas R is injected in the direction of the substrate 30, the second raw material gas R reacts with the chemical adsorption layer formed of the first raw material gas S, which has been already adsorbed on the substrate 30, or displaces a portion of the chemical adsorption layer, thereby finally forming a desired deposition film, e.g., an aluminum oxide ($Al_xO_y$) layer. At this time, an excessive second raw material gas R remains by forming a physical adsorption layer or is discharged through the exhaust unit 120.

Figure 3D:
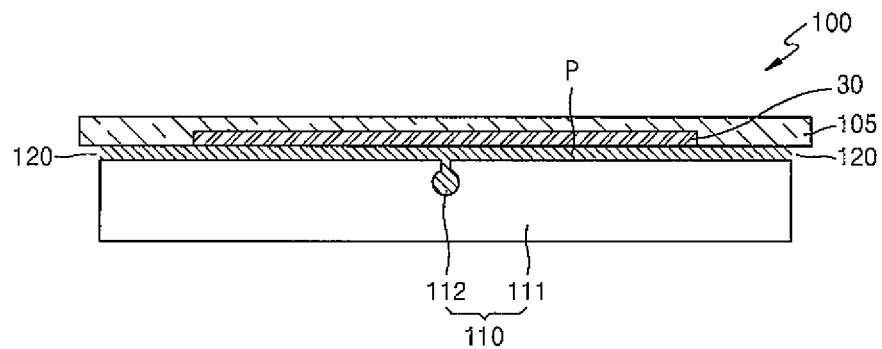

Thereafter, referring to FIG. 3D, the purge gas P is injected in the direction of the substrate 30 from the nozzle member 112 of the supply unit 110. The physical adsorption remaining on the surface of the substrate 30 is separated from the substrate 30 due to the purge gas P, and the separated gas or residual substances are removed through the exhaust unit 120, thereby improving the purity of a deposition film to be finally formed on the substrate 30.

According to the current embodiment, the supply unit 110 includes the nozzle member 112, and the first and second raw material gases S and R and the purge gas P are sequentially injected from the nozzle member 112 towards the center of the substrate 30. Accordingly, even during one cycle of the deposition process including a plurality of operations, the substrate 30 and the supply unit 110 do not have to move. In addition, the supply unit 110 does not have to be larger than necessary, and thus, the miniaturization of the vapor deposition apparatus 100 may be achieved.

In particular, the first raw material gas S, the second raw material gas R, and the purge gas P are sequentially injected by the nozzle member 112, and thus, an ALD process in which at least four operations form one cycle may be easily performed.

In addition, when an organic light-emitting display apparatus is manufactured using the substrate 30 by disposing the substrate 30 on the supply unit 110 such that a deposition surface of the substrate 30 faces the ground, the connectivity with a plurality of processes in which the substrate 30 faces the ground is improved.

FIG. 4 is a schematic cross-sectional view of a vapor deposition apparatus 200 according to another embodiment of the present invention, and FIG. 5 is a top view in a direction A of FIG. 4.

Referring to FIGS. 4 and 5, the vapor deposition apparatus 200 may include a stage 205, a supply unit 210, an exhaust unit 220, and curtain units 230A and 230B. For convenience, descriptions of similar components to those described above may not be provided again.

The substrate 30 is disposed on the stage 205. The stage 205 is disposed on the supply unit 210 such that a surface of the substrate 30, particularly, a surface on which a deposition process is to be performed, i.e., a lower surface of the substrate 30, faces the ground.

The supply unit 210 may include a main body member 211 and a nozzle member 212. The nozzle member 212 has a long extending shape. That is, as shown in FIG. 5, the nozzle member 212 is formed to have a length that is greater than a width of one direction of the substrate 30. As another example, the nozzle member 212 may have a length that is the same as the width of the one direction of the substrate 30. The nozzle member 212 may be disposed to correspond to the center of the substrate 30 to thereby easily perform the uniform deposition process.

The two curtain units 230A and 230B are disposed to face the stage 205. In addition, the curtain units 230A and 230B are disposed to deviate from edges of the substrate 30, i.e., not to overlap the substrate 30. The curtain units 230A and 230B include curtain main bodies 231A and 231B and curtain nozzles 232A and 232B, respectively. The curtain nozzles 232A and 232B inject a curtain gas towards the stage 205. The curtain main bodies 231A and 231B may include therein connection pipes for supplying the curtain gas to the curtain nozzles 232A and 232B, respectively. The curtain nozzles 232A and 232B may be symmetrically disposed at both ends based on the nozzle member 212. That is, the curtain nozzles 232A and 232B are disposed and oriented to one side of the substrate 30 and another side thereof facing the one side and not to overlap each other, respectively. The curtain gas injected by the curtain nozzles 232A and 232B may be an inert gas. The curtain gas prevents the escape of the first raw material gas S injected by the nozzle member 212 from the substrate 30 and largely from the stage 205. By doing this, damage of the outer side surfaces of the stage 205, the supply unit 210, and other portions of the vapor deposition apparatus 200 due to the first raw material gas S is prevented. In particular, the vapor deposition apparatus 200 may be disposed in a chamber, and in this case, the curtain gas injected by the curtain nozzles 232A and 232B functions to block the movement of the first raw material gas S to thereby prevent contamination or damage of the inner wall of the chamber due to the first raw material gas S.

According to another embodiment of the present invention, curtain nozzles may be disposed and oriented to all of four sides of the substrate 30. That is, although the curtain nozzles 232A and 232B are shown to be disposed and oriented to the left and right sides of the substrate 30 in FIG. 5, curtain nozzles may be further disposed and oriented to the top and bottom sides of the substrate 30, and all of these curtain nozzles may be connected to form a shape, such as a rectangular ring.

The curtain main bodies 231A and 231B of the curtain units 230A and 230B may have various shapes. As a more detailed example, the curtain main bodies 231A and 231B may be formed as one body with the main body member 211 of the supply unit 210 or formed independently.

The exhaust unit 220 may include a first exhaust unit 221 and a second exhaust unit 222. The first exhaust unit 221 and the second exhaust unit 222 of the exhaust unit 220 are disposed between the nozzle member 212 and the curtain units 230A and 230B, respectively. In addition, the exhaust unit 220 is disposed to correspond to or deviate from edges of the substrate 30. In addition, the exhaust unit 220 is formed to discharge gasses and the like towards the ground.

After the deposition process, residual gases are discharged through the exhaust unit 220, and in this case, since the residual gases are discharged in a direction that is opposite to a direction of injecting the first raw material gas S from the nozzle member 212, i.e., a direction of orienting to the ground, an exhaust characteristic is improved.

The deposition process using the vapor deposition apparatus 200 according to the current embodiment is similar to the above-described embodiment.

In the vapor deposition apparatus 200 according to the current embodiment, the curtain gas injected from the curtain units 230A and 230B functions as a curtain for blocking the movement of the first raw material gas S, thereby preventing contamination or damage of the inner wall of the chamber due to the first raw material gas S.

FIG. 6 is a schematic cross-sectional view of a vapor deposition apparatus 300 according to another embodiment of the present invention.

Referring to FIG. 6, the vapor deposition apparatus 300 may include a stage 305, a supply unit 310, an exhaust unit 320, and curtain units 330A and 330B. For convenience, descriptions of similar components to those described above may not be provided again.

The substrate 30 is disposed on the stage 305. The stage 305 is disposed on the supply unit 310 such that a surface of the substrate 30, particularly, a surface on which a deposition process is to be performed, i.e., a lower surface of the substrate 30, faces the ground.

The supply unit 310 may include a plurality of supply modules 310-1, 310-2, 310-3, 310-4, and 310-5. The supply module 310-1 may include a main body member 311 and a nozzle member 312. The nozzle member 312 has a long extending shape. That is, the nozzle member 312 is formed to have a length that is greater than a width of one direction of the substrate 30. As another example, the nozzle member 312 may have a length that is the same as the width of the one direction of the substrate 30.

The other supply modules 310-2, 310-3, 310-4, and 310-5 are the same as the supply module 310-1, and thus, a detailed description thereof is not provided.

The plurality of supply modules 310-1, 310-2, 310-3, 310-4, and 310-5 may have various forms, e.g., independent from each other or in one body. As a detailed example, the plurality of supply modules 310-1, 310-2, 310-3, 310-4, and 310-5 may have an integrated main body member and independent nozzle members.

The two curtain units 330A and 330B are disposed to face the stage 305. In addition, the curtain units 330A and 330B are disposed to deviate from edges of the substrate 30, i.e., not to overlap the substrate 30. The curtain units 330A and 330B include curtain main bodies 331A and 331B and curtain nozzles 332A and 332B, respectively. The curtain nozzles 332A and 332B inject a curtain gas towards the stage 305.

The curtain units 330A and 330B are the same as the curtain units 230A and 230B described above, and thus a detailed description thereof is not provided.

The exhaust unit 320 may include a first exhaust unit 321, a second exhaust unit 322, and a third exhaust unit 323. The first exhaust unit 321 and the second exhaust unit 322 of the exhaust unit 320 are disposed between the outermost nozzle members 312 and the curtain units 330A and 330B, respectively. That is, the first exhaust unit 321 is disposed between the nozzle member 312 of the supply module 310-1 and the curtain unit 330B, and the second exhaust unit 322 is disposed between the nozzle member 312 of the supply module 310-5 and the curtain unit 330B.

The third exhaust unit 323 is disposed between every two adjacent supply modules among the plurality of supply modules 310-1, 310-2, 310-3, 310-4, and 310-5. That is, four exhaust units 323 may be disposed.

A detailed description of the exhaust unit 320 is the same as the embodiment described above, and thus the detailed description of the exhaust unit 320 is not provided.

The vapor deposition apparatus 300 according to the current embodiment includes the supply unit 310 having the plurality of supply modules 310-1, 310-2, 310-3, 310-4, and 310-5. By this configuration of the supply unit 310, a uniform deposition film may be easily formed on the entire surface of the substrate 30 even in a state of fixing the substrate 30 and the vapor deposition apparatus 300.

In addition, the third exhaust unit 323 is disposed between every two adjacent supply modules in addition to the first exhaust unit 321 and the second exhaust unit 322, thereby improving the exhaust capability during the deposition process.

FIG. 7 is a schematic cross-sectional view of a vapor deposition apparatus 400 according to another embodiment of the present invention.

Referring to FIG. 7, the vapor deposition apparatus 400 may include a stage 405, a supply unit 410, an exhaust unit 420, and curtain units 430A and 430B. For convenience, descriptions of similar components to those described above may not be provided.

The substrate 30 is disposed on the stage 405. The stage 405 is disposed on the supply unit 410 such that a surface of the substrate 30, particularly, a surface on which a deposition process is to be performed, i.e., a lower surface of the substrate 30, faces the ground.

The supply unit 410 may include a plurality of supply modules 410-1, 410-2, 410-3, 410-4, and 410-5. The supply module 410-1 may include a main body member 411 and a nozzle member 412. The nozzle member 412 has a long extending shape. That is, the nozzle member 412 is formed to have a length that is greater than a width of one direction of the substrate 30. As another example, the nozzle member 412 may have a length that is the same as the width of the one direction of the substrate 30.

The nozzle member 412 may include a first injection region 412A, a second injection region 412B, and a partition 412C. The first injection region 412A and the second injection region 412B are formed to inject their respective raw material gases towards the substrate 30. The partition 412C is disposed between the first injection region 412A and the second injection region 412B to block mixing of the raw material gases injected by the first injection region 412A and the second injection region 412B. A detailed description of a deposition process using the first injection region 412A and the second injection region 412B will be described below.

The other supply modules 410-2, 410-3, 410-4, and 410-5 are the same as the supply module 410-1, and thus, a detailed description thereof is not provided.

The two curtain units 430A and 430B are disposed to face the stage 405. The curtain units 430A and 430B are the same as the curtain units 230A and 230B described above, and thus a detailed description thereof is not provided.

The exhaust unit 420 may include a first exhaust unit 421, a second exhaust unit 422, and a third exhaust unit 423. A detailed configuration of the exhaust unit 420 is the same as that of the exhaust unit 320 described above, and thus a detailed description thereof is not provided.

The current embodiment includes the plurality of supply modules 410-1, 410-2, 410-3, 410-4, and 410-5, but embodiments of the present invention are not limited thereto. That is, the configuration of the first injection region 412A, the second injection region 412B, and the partition 412C may be applied to the vapor deposition apparatuses 100 and 200 of FIGS. 1 and 4.

FIGS. 8A to 8D are cross-sectional views illustrating a deposition process using the vapor deposition apparatus 400 of FIG. 7.

Figure 8A:
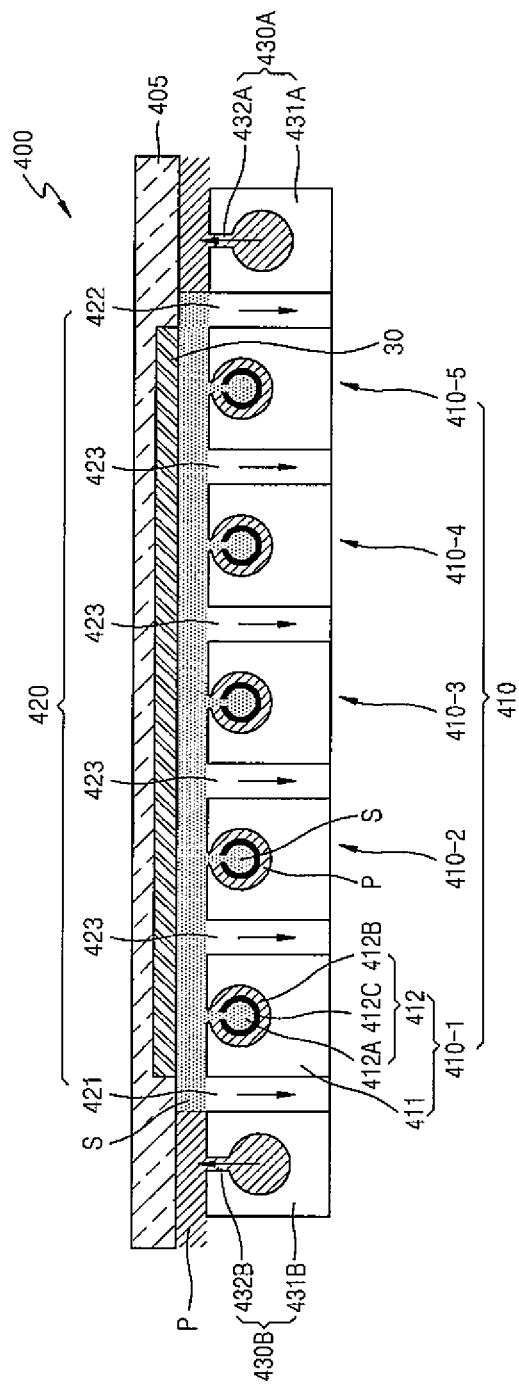

Referring to FIG. 8A, the first raw material gas S is injected in a direction of the substrate 30 from the first injection region 412A of the nozzle member 412. At this time, an inert gas, e.g., the purge gas P, is discharged from the second injection region 412B. The inert gas discharged from the second injection region 412B prevents contamination or damage of the second injection region 412B due to the first raw material gas S injected from the first injection region 412A. In addition, the partition 412C is disposed between the first injection region 412A and the second injection region 412B to thereby effectively distinguish the second injection region 412B from the first injection region 412A.

A curtain gas that is an inert gas, e.g., the purge gas P, is injected from the curtain nozzles 432A and 432B of the curtain units 430A and 430B.

When the first raw material gas S is injected in the direction of the substrate 30, a chemical adsorption layer and a physical adsorption layer which include the first raw material gas S are formed on the surface of the substrate 30. During this operation, the exhaust unit 420 discharges residual gases and unnecessary foreign substances therethrough.

Figure 8B:
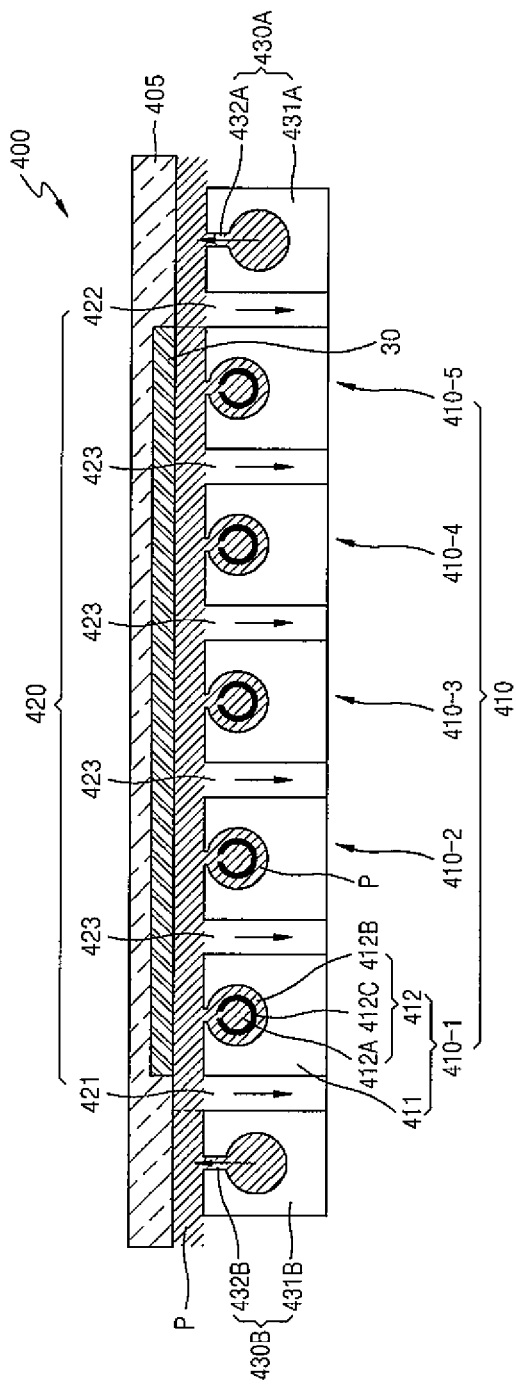

Thereafter, referring to FIG. 8B, the purge gas P is injected in the direction of the substrate 30 from the first injection region 412A and the second injection region 412B of the nozzle member 412. The purge gas P may include various materials. For example, the purge gas P may include an inert gas.

The curtain gas that is an inert gas, e.g., the purge gas P, is injected from the curtain nozzles 432A and 432B of the curtain units 430A and 430B. That is, the purge gas P may be concurrently or simultaneously injected from the first injection region 412A, the second injection region 412B, and the curtain nozzles 432A and 432B.

The exhaust unit 420 discharges residual gases and unnecessary foreign substances therethrough.

Figure 8C:
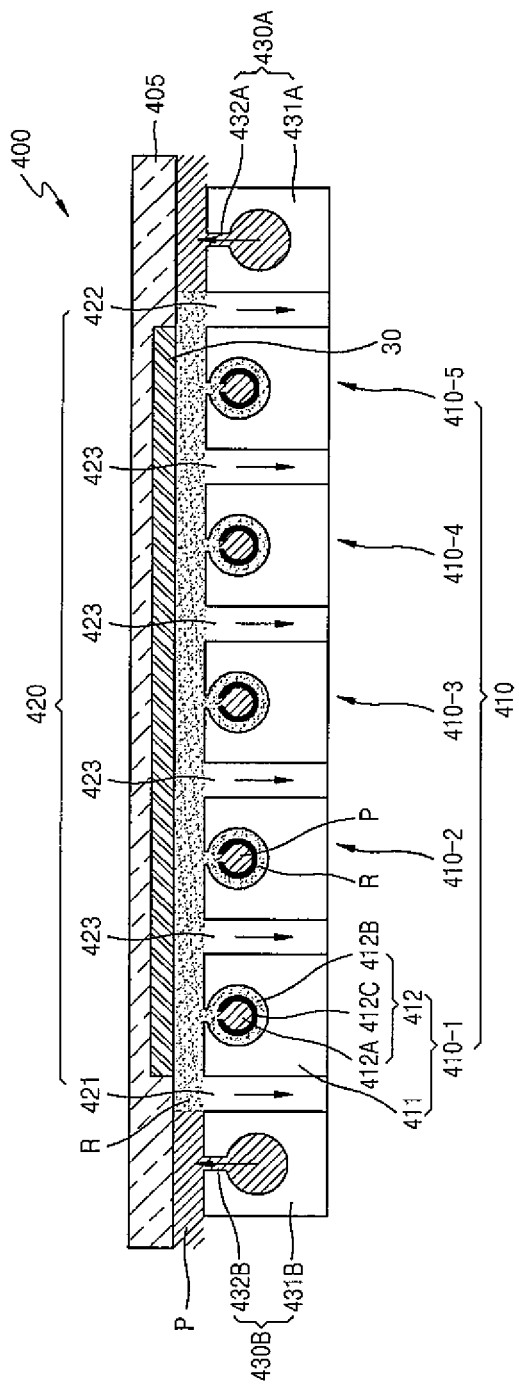

Thereafter, referring to FIG. 8C, the second raw material gas R is injected in the direction of the substrate 30 from the second injection region 412B of the nozzle member 412. At this time, an inert gas, e.g. the purge gas P, is discharged from the first injection region 412A. The inert gas discharged from the first injection region 412A prevents contamination or damage of the first injection region 412A due to the second raw material gas R injected from the second injection region 412B. In addition, the partition 412C is disposed between the first injection region 412A and the second injection region 412B to thereby effectively distinguish the first injection region 412A from the second injection region 412B.

The curtain gas that is an inert gas, e.g., the purge gas P, is injected from the curtain nozzles 432A and 432B of the curtain units 430A and 430B.

During this operation, the exhaust unit 420 discharges residual gases and unnecessary foreign substances therethrough.

Figure 8D:
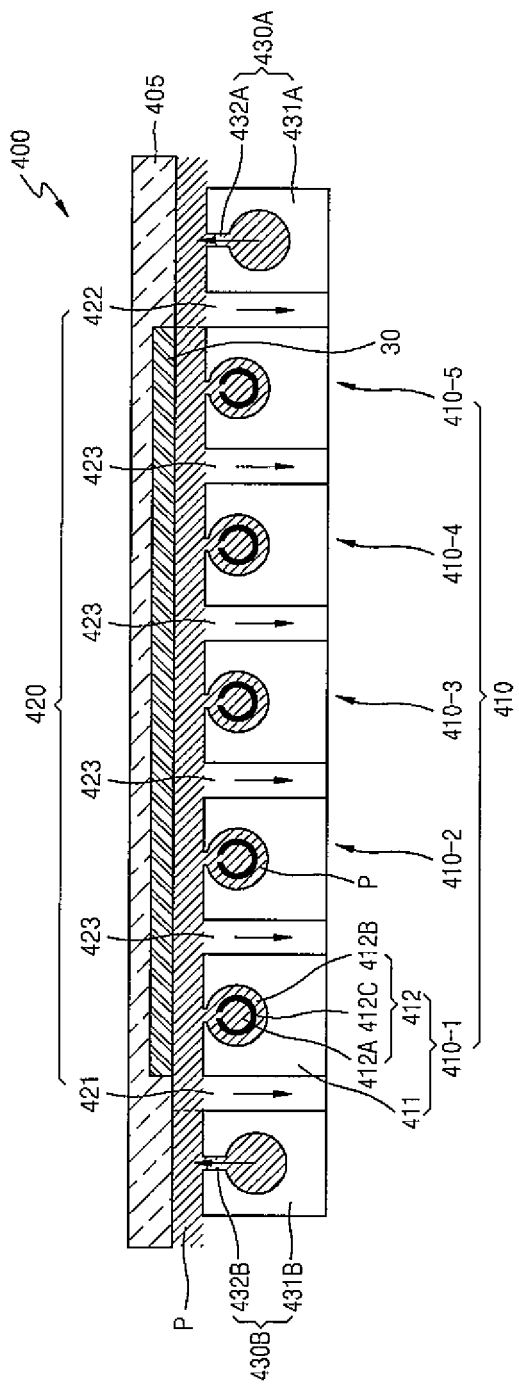

Thereafter, referring to FIG. 8D, the purge gas P is injected in the direction of the substrate 30 from the first injection region 412A and the second injection region 412B of the nozzle member 412. The purge gas P may include various materials. For example, the purge gas P may include an inert gas.

The curtain gas that is an inert gas, e.g., the purge gas P, is injected from the curtain nozzles 432A and 432B of the curtain units 430A and 430B. That is, the purge gas P may be concurrently or simultaneously injected from the first injection region 412A, the second injection region 412B, and the curtain nozzles 432A and 432B.

The exhaust unit 420 discharges residual gases and unnecessary foreign substances therethrough.

By these operations, a deposition film including the first raw material gas S and the second raw material gas R may be formed.

According to the current embodiment, the first raw material gas S and the second raw material gas R are sequentially injected from the nozzle member 412 towards the substrate 30. Accordingly, the substrate 30 and the vapor deposition apparatus 400 do not have to move.

In addition, the plurality of supply modules 410-1, 410-2, 410-3, 410-4, and 410-5 are provided to form a uniform deposition film on the substrate 30.

In addition, the nozzle member 412 includes the first injection region 412A and the second injection region 412B, the first raw material gas S is injected from the first injection region 412A, and the second raw material gas R is injected from the second injection region 412B. In addition, the inert gas is discharged from the second injection region 412B while the first raw material gas S is being injected from the first injection region 412A, and the inert gas is discharged from the first injection region 412A while the second raw material gas R is being injected from the second injection region 412B. By doing this, contamination of the first injection region 412A due to the second raw material gas R is prevented, and contamination of the second injection region 412B due to the first raw material gas S is prevented. In particular, this contamination prevention effect increases by the partition 412C.

FIG. 9 is a schematic cross-sectional view of a vapor deposition apparatus 500 according to another embodiment of the present invention.

Referring to FIG. 9, the vapor deposition apparatus 500 may include a stage 505, a supply unit 510, an exhaust unit 520, curtain units 530A and 530B, and a gas supply line 570. For convenience, descriptions of similar components to those described above may not be provided.

The substrate 30 is disposed on the stage 505. A mask 550 is disposed between the substrate 30 and the supply unit 510 to form a desired deposition pattern. The mask 550 may move and be aligned by a mask holder 551 and be disposed to be adjacent to the substrate 30. In addition, the substrate 30 may be supported and move by a substrate driving unit 560 and be stably disposed on the stage 505.

A housing 590 is disposed to surround the supply unit 510, the exhaust unit 520, and the curtain units 530A and 530B to protect the supply unit 510, the exhaust unit 520, and the curtain units 530A and 530B and to easily form a desired pressure atmosphere, e.g., a vacuum atmosphere, in a region in which a deposition process while the deposition process is being performed on the substrate 30.

The supply unit 510 may include a plurality of supply modules 510-1, 510-2, 510-3, 510-4, and 510-5. A configuration of the supply unit 510, the exhaust unit 520, and the curtain units 530A and 530B is similar to that of the vapor deposition apparatus 300 according to the embodiment of FIG. 6 described above, and thus, a detailed description thereof is not provided.

The gas supply line 570 supplies the first and second raw material gases S and R and the purge gas P to the supply unit 510. The gas supply line 570 has a linear as shown in FIG. 9. The first raw material gas S, the second raw material gas R, and the purge gas P are individually delivered to the gas supply line 570, in more detail, delivered through a first valve 571, a second valve 572, and a third valve 573, respectively.

In addition, a first inert gas valve 571I, a second inert gas valve 572I, and a third inert gas valve 573I for controlling injection of an inert gas I are disposed in a direction farther from the gas supply line 570 than the first valve 571, the second valve 572, and the third valve 573, respectively. The inert gas I may be delivered to the first valve 571, the second valve 572, and the third valve 573 through the first inert gas valve 571I, the second inert gas valve 572I, and the third inert gas valve 573I. By doing this, injection times and injection purities of the first raw material gas S, the second raw material gas R, and the purge gas P through the gas supply line 570 are easily controlled.

For example, when the first raw material gas S is delivered to the gas supply line 570 through the first valve 571, the second raw material gas R is not delivered to the supply line 570. To this end, a method of closing the second valve 572 may be used, but when opening and closing of the second valve 572 are repeated, the accurate control of the flow of the second raw material gas R is not easy. Thus, the inert gas I may be delivered through the second valve 572 under control of the second inert gas valve 572I by opening the second valve 572 without closing to thereby block the inflow of the second raw material gas R to the gas supply line 570. That is, only a desired gas may be delivered to the gas supply line 570 by using the first inert gas valve 571I, the second inert gas valve 572I, and the third inert gas valve 573I without repeating opening and closing of the first valve 571, the second valve 572, and the third valve 573.

FIG. 10 is a schematic cross-sectional view of an organic light-emitting display apparatus 10 manufactured by a method of manufacturing an organic light-emitting display apparatus according to another embodiment of the present invention, and FIG. 11 is a magnified view of F of FIG. 10.

In more detail, FIGS. 10 and 11 show the organic light-emitting display apparatus 10 manufactured using any one of the vapor deposition apparatuses 100, 200, 300, 400, and 500 described above. For convenience of description, a description below is made by using the vapor deposition apparatus 100 as an example.

The organic light-emitting display apparatus 10 includes the substrate 30. The substrate 30 may be formed of a glass material, a plastic material, or a metallic material.

A buffer layer 31 including an insulating material is formed on the substrate 30 to provide a planarization surface on the substrate 30 and prevent permeation of moisture and foreign substances into the substrate 30.

A thin film transistor (TFT), a capacitor 50, and an organic light-emitting device (OLED) 60 are formed on the buffer layer 31. The TFT largely includes an active layer 41, a gate electrode 42, and source and drain electrodes 43. The OLED may include a first electrode 61, a second electrode 62, and an intermediate layer 63. The capacitor 50 may include a first capacitor electrode 51 and a second capacitor electrode 52.

In more detail, the active layer 41 formed in a set or predetermined pattern is disposed on the upper surface of the buffer layer 31. The active layer 41 may include an inorganic semiconductor material, such as silicon, an organic semiconductor material, or an oxide semiconductor material and may be formed by doping a p- or n-type dopant thereinto.

A gate insulating layer 32 is formed on the active layer 41. The gate electrode 42 is formed on the gate insulating layer 32 to correspond to the active layer 41. The first capacitor electrode 51 is formed in the same layer and of the same material as the gate electrode 42.

An interlayer insulating layer 33 is formed to cover the gate electrode 42, and the source and drain electrodes 43 are formed on the interlayer insulating layer 33 to contact a set or predetermined regions of the active layer 41. The second capacitor electrode 52 is formed in the same layer and of the same material as the source and drain electrodes 43.

A passivation layer 34 is formed to cover the source and drain electrodes 43, and a separate insulating layer may be further formed on the passivation layer 34 for planarization of the TFT 40.

The first electrode 61 is formed on the passivation layer 34. The first electrode 61 is formed to electrically connect to any one of the source and drain electrodes 43. A pixel defining layer 35 is formed to cover the first electrode 61. A set or predetermined opening 64 is formed in the pixel defining layer 35, and the intermediate layer 63 having an organic emission layer is formed in a region limited to the opening 64, The second electrode 62 is formed on the intermediate layer 63.

An encapsulating layer 70 is formed on the second electrode 62. The encapsulating layer 70 may include an organic material or an inorganic material or may have a structure in which an organic material and an inorganic material are alternately stacked.

The encapsulating layer 70 may be formed using one of the vapor deposition apparatuses 100, 200, 300, 400, 500 described above. For example, a desired layer may be formed by passing, through the vapor deposition apparatus 100, the substrate 30 on which the second electrode 62 is formed.

In particular, the encapsulating layer 70 may include an inorganic layer 71 and an organic layer 72, the inorganic layer 71 may include a plurality of layers 71a, 71b, and 71c, and the organic layer 72 may include a plurality of layers 72a, 72b, and 72c. The plurality of layers 71a, 71b, and 71c of the inorganic layer 71 may be formed using one of the vapor deposition apparatuses 100, 200, 300, 400, 500.

However, embodiments of the present invention are not limited thereto. That is, the buffer layer 31, the gate insulating layer 32, the interlayer insulating layer 33, the passivation layer 34, the pixel defining layer 35, and other insulating layers may be formed using one of the vapor deposition apparatuses 100, 200, 300, 400, 500.

In addition, the active layer 41, the gate electrode 42, the source and drain electrodes 43, the first electrode 61, the intermediate layer 63, the second electrode 62, and other thin films may also be formed using the vapor deposition apparatus 100.

As described above, when the vapor deposition apparatus 100 is used, characteristics of deposition films formed in the organic light-emitting display apparatus 10 may be improved, resulting in improving electrical characteristics and image-quality characteristics of the organic light-emitting display apparatus 10.

As described above, one or more embodiments of the present invention provide a vapor deposition apparatus and a method of manufacturing an organic light-emitting display apparatus, wherein a deposition process may be efficiently performed and deposition film characteristics may be easily improved.

It should be understood that the embodiments herein are non-limiting examples and should be considered in a descriptive sense only. Descriptions of features or aspects within each embodiment should be considered as available for other similar features or aspects in other embodiments.

While embodiments of the present invention have been described with reference to the figures, it will be understood by those of ordinary skill in the art that various changes in form and details may be made therein without departing from the spirit and scope of the present invention as defined by the following claims and equivalents thereof.

What is claimed is:

1. A method of manufacturing an organic light-emitting display apparatus comprising a thin film on a substrate by using a vapor deposition apparatus, the vapor deposition apparatus comprising:

a stage onto which the substrate is disposed; and a supply unit disposed to face the substrate and comprising a main body member and a nozzle member disposed on one surface of the main body member facing the substrate, to sequentially supply a plurality of gases towards the substrate, the method comprising forming the thin film, wherein the forming of the thin film is performed by sequentially injecting a plurality of raw material gases from the nozzle member in a state where the substrate and the vapor deposition apparatus are fixed, wherein the nozzle member has a length and a width, the length being greater than the width along one direction of the substrate, wherein the length of the nozzle member is equal to or greater than a width of the substrate, and wherein the stage is disposed over the supply unit for the substrate to be disposed onto the stage during the forming of the thin film such that a surface of the substrate on which a deposition process is performed faces downward.

2. The method of claim 1, wherein the organic light-emitting display apparatus comprises a first electrode, an intermediate layer having an organic emission layer, a second electrode, and an encapsulating layer, and the forming of the thin film comprises forming the encapsulating layer.

3. The method of claim 1, wherein the forming of the thin film comprises forming an insulating layer.

4. The method of claim 1, wherein the forming of the thin film comprises forming a conductive layer.

* * * * *